(12) United States Patent
Komada

(10) Patent No.: US 8,673,404 B2
(45) Date of Patent: *Mar. 18, 2014

(54) BARRIER FILM AND LAMINATED MATERIAL, CONTAINER FOR WRAPPING AND IMAGE DISPLAY MEDIUM USING THE SAME, AND MANUFACTURING METHOD FOR BARRIER FILM

(75) Inventor: Minoru Komada, Tokyo (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 351 days.

This patent is subject to a terminal disclaimer.

(21) Appl. No.: 12/509,601

(22) Filed: Jul. 27, 2009

(65) Prior Publication Data

US 2009/0280266 A1 Nov. 12, 2009

Related U.S. Application Data

(62) Division of application No. 10/417,588, filed on Apr. 17, 2003, now abandoned.

(30) Foreign Application Priority Data

Apr. 18, 2002 (JP) ................................. 2002-115776
Apr. 18, 2002 (JP) ................................. 2002-115777

(51) Int. Cl.
*C23C 16/10* (2006.01)
*C23C 16/08* (2006.01)
*C23C 16/24* (2006.01)
*B32B 27/08* (2006.01)
*H05H 1/24* (2006.01)

(52) U.S. Cl.
USPC ........... 427/524; 427/527; 427/529; 427/525; 204/192.14; 204/192.23; 204/192.3

(58) Field of Classification Search
None
See application file for complete search history.

(56) References Cited

U.S. PATENT DOCUMENTS 3,849,344 A * 11/1974 McMurtry et al. ............. 6/286.8
4,375,443 A * 3/1983 Kipperman et al. .......... 264/620
(Continued)

FOREIGN PATENT DOCUMENTS

JP 8-164595 A 6/1996
JP 309815 * 11/1999
(Continued)

OTHER PUBLICATIONS

USPTO Office Action mailed Nov. 1, 2004 for parent U.S. Appl. No. 10/417,588.

(Continued)

*Primary Examiner* — Marianne L Padgett
(74) *Attorney, Agent, or Firm* — Ladas & Parry LLP

(57) ABSTRACT

An object of the present invention is to provide a barrier film having the extremely high barrier property and the better transparency, a method for manufacturing the same, and a laminated material, a container for wrapping and an image displaying medium using the barrier film. According to the present invention, there is provided a barrier film provided with a barrier layer on at least one surface of a substrate film, wherein the barrier layer is a silicon oxide film having an atomic ratio in a range of Si:O:C=100:160 to 190:30 to 50, a peak position of infrared-ray absorption due to Si—O—Si stretching vibration between 1030 to 1060 cm$^{-1}$, a film density in a range of 2.5 to 2.7 g/cm$^3$, and a distance between grains of 30 nm or shorter. Still more, there is provided a barrier film provided with a barrier layer on at least one surface of a substrate film, wherein the barrier layer is a silicon oxi-nitride film having an atomic ratio in a range of Si:O:N:C=100:80 to 110:40 to 70:30 to 50, a maximum peak of infrared-ray absorption due to Si—O stretching vibration and Si—N stretching vibration in a range of 900 to 1000 cm$^{-1}$, a film density in a range of 2.7 to 3.0 g/cm$^3$, and a distance between grains of 30 nm or shorter.

4 Claims, 7 Drawing Sheets

(56) References Cited

U.S. PATENT DOCUMENTS

| | | | |
|---|---|---|---|
| 4,604,181 A * | 8/1986 | Mirtich et al. | 204/298.26 |
| 5,718,967 A | 2/1998 | Hu et al. | |
| 5,725,958 A | 3/1998 | Matsuda et al. | |
| 6,217,969 B1 * | 4/2001 | Takahashi et al. | 428/64.1 |
| 6,666,958 B1 * | 12/2003 | Yoshikawa et al. | 204/192.23 |
| 7,651,594 B2 * | 1/2010 | Komada et al. | 204/192.15 |
| 7,998,324 B2 * | 8/2011 | Watanabe et al. | 204/298.13 |
| 8,475,929 B2 * | 7/2013 | Komada et al. | 428/451 |
| 2001/0038894 A1 | 11/2001 | Komada | |
| 2002/0006487 A1 | 1/2002 | O'Connor et al. | |
| 2011/0177342 A1 * | 7/2011 | Itoh et al. | 428/414 |

FOREIGN PATENT DOCUMENTS

| | | | |
|---|---|---|---|
| JP | 2000-127287 | * | 5/2000 |
| JP | 2002-361774 | * | 12/2002 |
| JP | 4-524577 A | | 2/2004 |
| JP | 2008-214169 A | | 9/2008 |

OTHER PUBLICATIONS

USPTO Office Action mailed Jul. 19, 2005 for parent U.S. Appl. No. 10/417,588.

USPTO Office Action mailed May 22, 2008 for parent U.S. Appl. No. 10/417,588.

* cited by examiner

BARRIER FILM AND LAMINATED MATERIAL, CONTAINER FOR WRAPPING AND IMAGE DISPLAY MEDIUM USING THE SAME, AND MANUFACTURING METHOD FOR BARRIER FILM

BACKGROUND OF THE INVENTION

1. Field of the Invention

The present invention relates to a barrier film having the extremely high barrier property which is used as a wrapping material for foods, medical products and the like, a packaging material for electronic devices and the like, or a substrate material, a method for manufacturing the same, and a laminated material, a container for wrapping and an image displaying medium using this barrier film.

2. Description of the Related Art

Conventionally, as a wrapping material having the barrier property to an oxygen gas and water vapor, and the better storage suitability for foods, medical products and the like, various materials have been developed and proposed, such as a barrier film having a composition in which a coating layer of polyvinylidene chloride or an ethylene vinyl alcohol copolymer is provided on a flexible plastic substrate.

However, in these barrier films, there is a problem that the barrier property to oxygen and water vapor is not sufficient, and the barrier property is remarkably reduced, in particular, at sterilization treatment at a high temperature. Further, a barrier film with a coating layer of polyvinylidene chloride provided thereon generates harmful dioxin at burning, and adverse effect on the environment is concerned.

Therefore, recently, a barrier film having a composition of an inorganic oxide deposition film such as silicon oxide, aluminium oxide and the like is provided on a substrate film, has been proposed. In addition, lamination, of a resin layer comprising an epoxy resin or a mixture thereof with the above-mentioned deposition film, is proposed (JP-A 8-164595).

On the other hand, in an electronic device, for example, in an image displaying device such as flexible display, when a barrier film is used as a substrate for a plastic film base which is a substitute for a glass substrate, or when a barrier film is used as a cover film for a solar cell module, the higher barrier property as compared with the barrier property required in utility of the conventional wrapping (e.g. an oxygen transmission rate is 1.0 cc/m$^2$/day•atm or smaller, a water vapor transmission rate is 11.0 g/m$^2$/day or smaller) is required to a barrier film. In addition, the heat resistance and the chemical resistance such as resistance to a high temperature at preparation of a display element and various treating chemicals are required to a barrier film and, further, also after the barrier film is made into products, it is required to maintain a high barrier property under the severe environment such as a resistance to wet heat test.

The conventional barrier film with an inorganic oxide deposition film such as silicon oxide, aluminium oxide and the like provided thereon is excellent in the transparency, and has little influence on the environment, and an its demand for a wrapping material and the like is greatly expected. However, the barrier property of these barrier films is still lower as compared with a laminated material for wrapping using an aluminium foil, and there is a problem in serviceability in use in an electronic device requiring the particularly high barrier property (e.g. an oxygen transmission rate is 0.1 cc/m$^2$/day•atm or smaller, a water vapor transmission rate is 0.1 g/m$^2$/day or smaller).

SUMMARY OF THE INVENTION

The present invention has been achieved in order to solve the above problems. It is an object of this invention to provide a barrier film having the extremely high barrier property and also a better transparency, a method for manufacturing the same, and a laminated material, a container for wrapping and an image displaying medium using the barrier film.

In order to achieve the above object, in the first embodiment of the present invention, a barrier film provided with a barrier layer on at least one surface of a substrate film, has a composition wherein the barrier layer is a silicon oxide film, and the silicon oxide film has an atomic ratio in a range of Si:O:C=100:160 to 190:30 to 50, a peak position of infrared-ray absorption due to Si—O—Si stretching vibration is between 1030 to 1060 cm$^{-1}$, a film density is in a range of 2.5 to 2.7 g/cm$^3$, and a distance between grains is 30 nm or shorter.

In other aspect of the present invention, the barrier film has a composition wherein the barrier layer is provided on the substrate film via a resin layer.

In other aspect of the present invention, the barrier film has a composition wherein a resin layer is provided on the barrier layer.

In other aspect of the present invention, the barrier film has a composition wherein oxygen transmission rate thereof is 0.1 cc/m$^2$/day•atm or lower, and water vapor transmission rate thereof is 0.1 g/m$^2$/day or lower.

In the present invention, a laminated material has a composition wherein a heat sealable resin layer is provided on at least one surface of the above barrier film.

In the present invention, a container for wrapping has a composition wherein the container is obtained by making a bag or a can by heat anastomosing the heat sealable resin layer using the above laminated material.

In addition, in the present invention, a laminated material has a composition wherein a conductive layer is provided on at least one surface of the above barrier film.

In the present invention, an image displaying medium has a composition wherein an image displaying layer is provided on the conductive layer using the above laminated material as a substrate.

In the present invention, a method for manufacturing a barrier film comprises forming a silicon oxide film on a substrate film as a barrier layer wherein the silicon oxide film has an atomic ratio in a range of Si:O:C=100:160 to 190:30 to 50, a peak position of infrared-ray absorption due to Si—O—Si stretching vibration is between 1030 to 1060 cm$^{-1}$, a film density is in a range of 2.5 to 2.7 g/cm$^3$ and a distance between grains is 30 nm or shorter, by using either of silicon having a sintered density of 80% or higher or SiO$_x$ ('x' is 1 to 2) having a sintered density of 80% or higher as a film forming material in the presence of an oxygen gas by a ion plating method.

In other aspect of the present invention, the method for manufacturing a barrier film has a composition wherein the ion plating method is a hollow cathode type ion plating method.

In other aspect of the present invention, the method for manufacturing a barrier film has a composition wherein a resin layer is provided on the substrate film in advance, and the barrier layer is formed on the resin layer.

In such the present invention, by rendering an atomic ratio in a silicon oxide film, a peak position of infrared-ray absorption due to Si—O—Si stretching vibrations, a film density and a distance between grains in specified ranges, the silicon oxide film becomes to have a compact structure, and a barrier layer comprising this silicon oxide film gives a high barrier property and transparency to the barrier film.

Still more, in the second embodiment of the present invention, a barrier film provided with a barrier layer on at least one surface of a substrate film, has a composition wherein the barrier layer is a silicon oxi-nitride film, and the silicon oxi-nitride film has an atomic ratio in a range of Si:O:N:C=100:80 to 110:40 to 70:30 to 50, a maximum peak of infrared-ray absorption due to Si—O stretching vibration and Si—N stretching vibration in a range of 900 to 1000 cm$^{-1}$, a film density is in a range of 2.7 to 3.0 g/cm$^3$, and a distance between grains is 30 nm or shorter.

In other aspect of the present invention, the barrier film has a composition wherein the barrier layer is provided on the substrate film via a resin layer.

In other aspect of the present invention, the barrier film has a composition wherein a resin layer is provided on the barrier layer.

In other aspect of the present invention, the barrier film has a composition wherein oxygen transmission rate thereof is 0.1 cc/m$^2$/day·atm or lower, and water vapor transmission rate thereof is 0.1 g/m$^2$/day or lower.

In the present invention, a laminated material has a composition wherein a heat sealable resin layer is provided on at least one surface of the above barrier film.

In the present invention, a container for wrapping has a composition wherein the container is obtained by making a bag or a can by heat anastomosing the heat sealable resin layer using the above laminated material.

In addition, in the present invention, a laminated material has a composition wherein a conductive layer is provided on at least one surface of the above barrier film.

In the present invention, an image displaying medium has a composition wherein an image displaying layer is provided on the conductive layer using the above laminated material as a substrate.

In the present invention, a method for manufacturing a barrier film comprises forming a silicon oxi-nitride film on a substrate film as a barrier layer wherein the silicon oxi-nitride film has an atomic ratio in a range of Si:O:N:C=100:80 to 110:40 to 70:30 to 50, a maximum peak of infrared-ray absorption due to Si—O stretching vibration and Si—N stretching vibration in a range of 900 to 1000 cm$^1$, a film density is in a range of 2.7 to 3.0 g/cm$^3$ and a distance between grains is 30 nm or shorter, by using either of silicon having a sintered density of 80% or higher or silicon oxide having a sintered density of 80% or higher as a film forming material in the presence of a nitrogen gas, or in the presence of a nitrogen gas and an oxygen gas by a ion plating method.

In other aspect of the present invention, the method for manufacturing a barrier film has a composition wherein the ion plating method is a hollow cathode type ion plating method.

In other aspect of the present invention, the method for manufacturing a barrier film has a composition wherein a resin layer is provided on the substrate film in advance, and the barrier layer is formed on the resin layer.

In such the present invention, by rendering an atomic ratio in a silicon oxi-nitride film, a maximum peak of infrared-ray absorption due to Si—O stretching vibration and Si—N stretching vibration, a film density and a distance between grains in specified ranges, the silicon oxi-nitride film becomes to have a compact structure, and a barrier layer comprising this silicon oxi-nitride film gives a high barrier property and transparency to the barrier film.

As described above in detail, according to the present invention, a barrier film is provided with a barrier layer on at least one surface of a substrate film, this barrier layer is a silicon oxide film having an atomic ratio in a range of Si:O:C=100:160 to 190:30 to 50, a peak position of infrared-ray absorption due to Si—O—Si stretching vibration is between 1030 to 1060 cm$^{-1}$, a film density is in a range of 2.5 to 2.7 g/cm$^3$, and a distance between grains is 30 nm or shorter, therefore, the barrier layer has a compact structure, thereby, a barrier film having the extremely high barrier property and the excellent transparency becomes possible.

Still more, according to the present invention, a barrier film is provided with a barrier layer on at least one surface of a substrate film, this barrier layer is a silicon oxi-nitride film having an atomic ratio in a range of Si:O:N:C=100:80 to 110:40 to 70:30 to 50, a maximum peak of infrared-ray absorption due to Si—O stretching vibration and Si—N stretching vibration in a range of 900 to 1000 cm$^{-1}$, a film density is in a range of 2.7 to 3.0 g/cm$^3$, and a distance between grains is 30 nm or shorter, therefore, the barrier layer has a compact structure, thereby, a barrier film having the extremely high barrier property and the excellent transparency becomes possible.

In addition, by intervening a resin layer between a substrate film and a barrier layer, a dimensional change in a substrate film at formation of a barrier layer is prevented, and the adhesion between a substrate film and a barrier layer becomes higher, and, thus, a barrier film having a improved barrier property becomes possible.

Further, by provision of a resin layer on a barrier layer, this resin layer functions as a protective film and gives the heat resistance, the chemical resistance and the weather resistance to a barrier film and, at the same time, even when a barrier layer has a defective part, by filling the part, it becomes possible to maintain the high barrier property.

According to the method for manufacturing of the present invention, the barrier film of the present invention can be manufactured simply, and the barrier film of the present invention can be preferably used in utility requiring the extremely high barrier property, for example, wrapping materials for foods, medical products and the like, packaging materials such as electronic devices, and the like.

DESCRIPTION OF THE PREFERRED EMBODIMENTS

Figure 1:
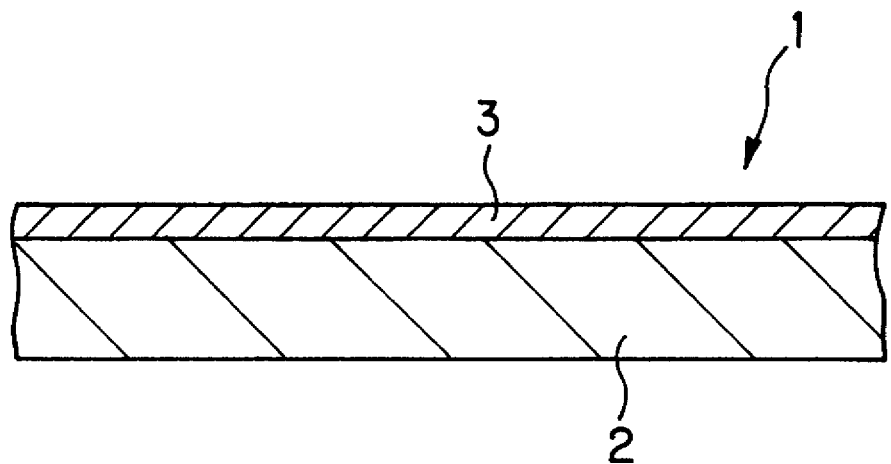
FIG. 1 is a schematic cross-sectional view showing one embodiment of a barrier film of the present invention.

Next, embodiments of the present invention will be explained by referring to the drawings.

(Barrier Film)

FIG. 1 is a schematic cross-sectional view showing one embodiment of a barrier film of the present invention. In FIG. 1, a barrier film 1 is provided with a substrate film 2, and a barrier layer 3 formed on one surface of this substrate film 2. Still more, a barrier film 1 of the present invention may be provided with a barrier layer 3 on both surfaces of a substrate film 2.

Figure 2:
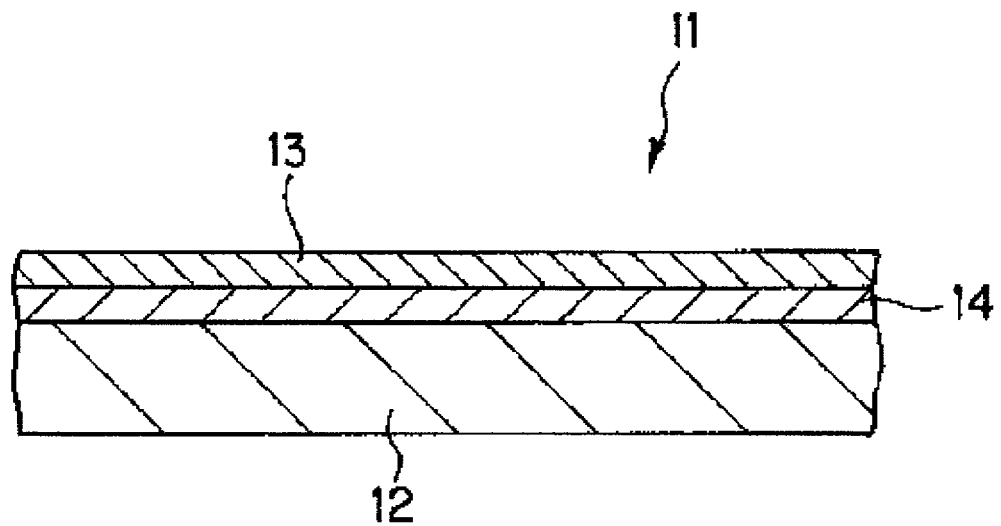
FIG. 2 is a schematic cross-sectional view showing another embodiment of a barrier film of the present invention.

FIG. 2 is a schematic cross-sectional view showing another embodiment of a barrier film of the present invention. In FIG. 2, a barrier film 11 is provided with a substrate film 12, and a barrier layer 13 formed on one surface of this substrate film 12 via a resin layer 14. Still more, a barrier film 11 of the present invention may be such that a resin layer 14 and a barrier layer 13 are laminated on both surfaces of a substrate film 12. Still more, a barrier film 11 may be formed by repeating lamination of a resin layer 14 and a barrier layer 13 for two or more times.

Figure 3:
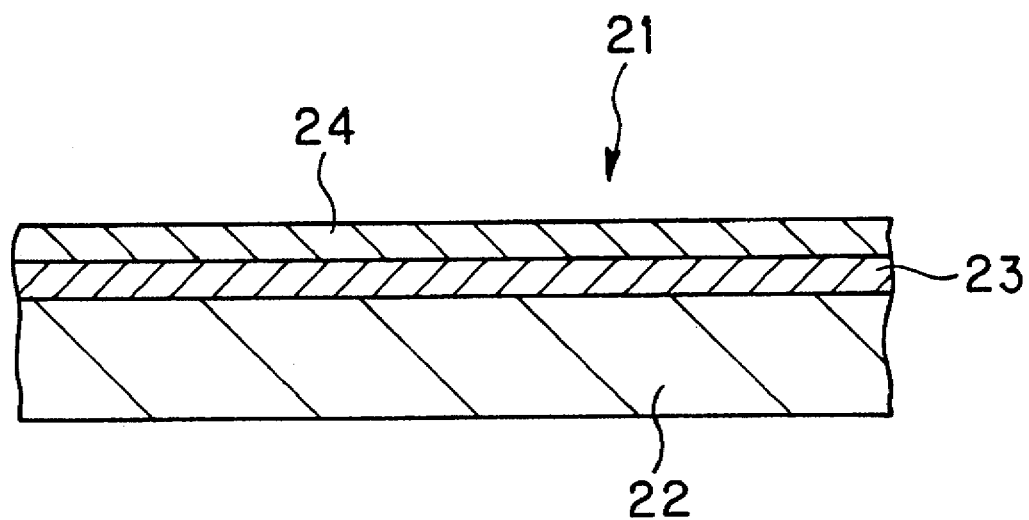
FIG. 3 is a schematic cross-sectional view showing another embodiment of a barrier film of the present invention.

In addition, FIG. 3 is a schematic cross-sectional view showing another embodiment of a barrier film of the present invention. In FIG. 3, a barrier film 21 is provided with a substrate film 22, and a barrier layer 23 and a resin layer 24 which are laminated in this order on one surface of this substrate film 22. Still more, a barrier film 21 of the present invention may be such that a barrier layer 23 and a resin layer 24 are laminated in this order on both surfaces of a substrate film 22. Still more, a barrier film 21 may be formed by repeating lamination of a barrier layer 23 and a resin layer 24 for two or more times.

Then, each constituent member of the above-mentioned barrier film of the present invention will be explained.

(Substrate Film)

A substrate film constituting a barrier film of the present invention is not particularly limited as far as the film can retain a barrier layer, or a barrier layer and a resin layer, and can be appropriately selected depending on intended use of a barrier film. Specifically, as a substrate film, oriented (monoaxial or biaxial) or non-oriented flexible transparent resin films of polyolefin series resins such as polyethylene, polypropylene, polybutene and the like; amorphous polyolefin series resins such as cyclic polyolefin and the like; (meth) acrylic series resins; polyvinyl chloride series resins; polystyrene series resins; saponified ethylene-vinyl acetate copolymer; polyvinyl alcohol series resins such as polyvinyl alcohol resin, ethylene-vinyl alcohol copolymer and the like; polycarbonate series resins; polyvinyl butyrate resins; polyalylate resins; fluorine series resins such as ethylene-ethylene tetrafluoride copolymer, ethylene chloride trifluoride, ethylene tetrafluoride-perfluoroalkyl vinyl ether copolymer, vinylidene fluoride, vinyl fluoride, perfluoro-perfluoropropylene-perfluorovinyl ether copolymer and the like; polyvinyl acetate series resins; acetal series resins; polyester series resins such as polyethylene terephthalate (PET), polyethylene 2,6-naphthalate (PEN) and the like; polyamide series resins such as nylon (trade name) 6, nylon (trade name) 12, copolymerized nylon (trade name) and the like; polyimide resins; polyetherimide resins; polysulfone resins; polyethersulfone resins; polyether ether ketone resins can be used. A thickness of a substrate film can be appropriately set in a range of 5 to 500 μm, preferably 10 to 200 μm.

(Barrier Layer)

A barrier layer constituting a barrier film of the first embodiment of the present invention is a silicon oxide film having an atomic ratio in a range of Si:O:C=100:160 to 190:30 to 50. In this silicon oxide film, a peak position of infrared-ray absorption due to Si—O—Si stretching vibration is between 1030 to 1060 cm$^{-1}$, a film density is in a range of 2.5 to 2.7 g/cm$^3$, preferably 2.6 to 2.7 g/cm$^3$, and a distance between grains is 30 nm or smaller, preferably in a range of 10 to 30 nm, more preferably 10 to 20 nm. A distance between grains reflects a growing nucleus distribution density at preparation of a silicon oxide film and, when there are many growing nuclei, and a film is manufactured elaborately, micro crystals (grains) cover a substrate film or a resin layer without any gap.

When an atomic ratio, an infrared-ray absorbing band region due to Si—O—Si stretching vibration, a film density and a distance between grains of a silicon oxide film which is a barrier layer are out of the above-mentioned ranges, elaboration of a silicon oxide film is reduced, the extremely high barrier property (indicates an oxygen transmission rate is 0.1 cc/m$^2$/day•atm or smaller, a water vapor transmission rate is around 0.1 g/m$^2$/day or smaller) can not be obtained, a silicon oxide film becomes hard and brittle, and the durability is reduced, being not preferable.

Herein, in the present invention, the above-mentioned an atomic ratio is measured by a photoelectron spectroscopy (Electron Spectroscopy for Chemical Analysis; ESCA). In addition, peak position of infrared-ray absorption due to Si—O—Si stretching vibration is measured using a Fourier transform infrared spectrometer (Herschel FT-IR-610 manufactured by JASCO Corporation) provided with a multiple reflection (Attenuated Total Reflection; ATR) measuring apparatus. In addition, the above-mentioned film density is measured with a X-ray reflectivity measuring apparatus (ATX-E manufactured by Rigaku Corporation). Further, the above-mentioned distance between grains is measured by using an atom force microscope (AFM) (Nano ScopeIII manufactured by Digital Instruments).

Such the barrier layer can be formed by an ion plating method such as a hollow cathode type ion plating method and the like. A thickness of a barrier layer can be appropriately set in a range of 5 to 500 nm, preferably 10 to 100 nm. When a thickness of a barrier layer is thinner than 5 nm, the extremely high barrier property (indicates an oxygen transmission rate is 0.1 cc/m$^2$/day•atm or smaller, and a water vapor transmission rate is around 0.1 g/m$^2$/day or smaller) can not be manifested. On the other hand, when a thickness of a barrier layer exceeds 500 nm, a great stress is exerted and, when a substrate film is flexible, a crack is easily caused in a barrier layer, the barrier property is reduced and, at the same time, a time necessary for manufacturing a film becomes longer, being not preferable.

A barrier layer constituting a barrier film of the second embodiment of the present invention is a silicon oxi-nitride film having an atomic ratio in a range of Si:O:N:C=100:80 to 110:40 to 70:30 to 50. In this silicon oxi-nitride film, a maximum peak of infrared-ray absorption due to Si—O stretching vibration and Si—N stretching vibration in a range of 900 to 1000 cm$^{-1}$, a film density is in a range of 2.7 to 3.0 g/cm$^3$, preferably 2.8 to 3.0 g/cm$^3$, and a distance between grains is 30 nm or smaller, preferably in a range of 10 to 30 nm, more preferably 10 to 20 mm. If there are a maximum peak of infrared-ray absorption due to Si—O stretching vibration and a maximum peak of infrared-ray absorption due to Si—N stretching vibration, a maximum peak of infrared-ray absorption due to Si—O stretching vibration and Si—N stretching vibration indicates the greater peak. And if there is one maximum peak of infrared-ray absorption due to Si—O stretching vibration and Si—N stretching vibration, it indicates the peak absorption. A distance between grains reflects a growing nucleus distribution density at preparation of a silicon oxi-nitride film and, when there are many growing nuclei, and a film is manufactured elaborately, micro crystals (grains) cover a substrate film or a resin layer without any gap.

When an atomic ratio, a maximum peak of infrared-ray absorption due to Si—O stretching vibration and Si—N stretching vibration, a film density and a distance between grains of a silicon oxi-nitride film which is a barrier layer are out of the above-mentioned ranges, elaboration of a silicon oxi-nitride film is reduced, the extremely high barrier property (indicates an oxygen transmission rate is 0.1 cc/m$^2$/day•atm or smaller, a water vapor transmission rate is around 0.1 g/m$^2$/day or smaller) can not be obtained, a silicon oxi-nitride film becomes hard and brittle, and the durability is reduced, being not preferable.

Herein, in the present invention, the above-mentioned an atomic ratio is measured by a photoelectron spectroscopy (Electron Spectroscopy for Chemical Analysis; ESCA). In addition, the maximum peak of infrared-ray absorption due to Si—O stretching vibration and Si—N stretching vibration is measured using a Fourier transform infrared spectrophotometer (Herschel FT-IR-610 manufactured by JASCO Corporation) provided with a multiple reflection (Attenuated Total Reflection; ATR) measuring apparatus. In addition, the above-mentioned film density is measured with a X-ray reflectivity measuring apparatus (ATX-E manufactured by Rigaku Corporation). Further, the above-mentioned distance between grains is measured by using an atom force microscope (AFM) (Nano ScopeIII manufactured by Digital Instruments).

Such the barrier layer can be formed by an ion plating method such as a hollow cathode type ion plating method and the like. A thickness of a barrier layer can be appropriately set in a range of 5 to 500 nm, preferably 10 to 200 nm. When a thickness of a barrier layer is smaller than 5 nm, the extremely high barrier property (indicates an oxygen transmission rate is 0.1 cc/m$^2$/day•atm or smaller, and a water vapor transmission rate is around 0.1 g/m$^2$/day or smaller) can not be manifested. On the other hand, when a thickness of a barrier layer exceeds 500 nm, a great stress is exerted and, when a substrate film is flexible, a crack is easily caused in a barrier layer, the barrier property is reduced and, at the same time, a time necessary for manufacturing a film becomes longer, being not preferable.

(Resin Layer)

A resin layer 14 constituting a barrier film 11 of the present invention is for improving the adhesion between a substrate film 12 and a barrier layer 13, and for improving the barrier property. In addition, a resin layer 24 covering a barrier layer 23 functions as a protecting film and is for giving the heat resistance, the chemical resistance and the weather resistance to a barrier film 21 and, at the same time, for improving the barrier property by filling a defective part even when a barrier layer 23 has the defective part.

Such the resin layer can be formed from one kind, or a combination of 2 or more commercially available resin materials such as polyamic acid, a polyethylene resin, a melamine resin, a polyurethane resin, a polyester resin, a polyol resin, a polyurea resin, a polyazomethine resin, a polycarbonate resin, a polyacrylate resin, a polystyrene resin, a polyacrylonitrile (PAN) resin, a polyethylene naphthalate (PEN) and the like, a curing epoxy resin containing a high-molecular weight epoxy polymer which is a polymer of a bifunctional epoxy resin and a bifunctional phenols, and a resin material used in the above-mentioned substrate film, an anchor coating agent used in a laminated material described later, an adhesive, a heat sealable resin material and the like. It is preferable that a thickness of a resin layer is appropriately set depending on a material to be used and, for example, the thickness can be set in a range of around 5 nm to $5 \times 10^5$ nm.

In addition, in the present invention, a non-fibrous inorganic filler having an average particle diameter in a range of 0.8 to 5 µm may be contained in a resin layer. Examples of the non-fibrous inorganic filler to be used include aluminium hydroxide, magnesium hydroxide, talc, alumina, magnesia, silica, titanium dioxide, clay and the like and, in particular, sintered clay can be preferably used. Such the inorganic filler can be contained in a range of 10 to 60% by volume, preferably 25 to 45% by weight of a resin layer.

Method for Manufacturing Barrier Film

Next, a method for manufacturing a barrier film of the present invention will be explained.

In a method for manufacturing a barrier film of the first embodiment of the present invention, a barrier layer is formed by an ion plating method. As an ion plating method, any of a hollow cathode type ion plating method, a hollow anode type ion plating method and others are used. A film is manufactured in the presence of an oxygen gas using silicon having a sintered density of 80% or greater, or $SiO_x$ ('x' equals 1 to 2) having a sintered density of 80% or greater, as a film forming material. By rendering a density of a film forming material 80% or greater, it becomes possible to form an elaborated silicon oxide film. In addition, since forming a film by the above-mentioned ion plating method is a reactive forming of film, processed under presence of oxygen, control of oxidation degree is easy and, further, by rendering a distance between a film forming material and a material on which a film is to be formed, and an input electric power adequate, suitable etching is generated in a material on which a film is to be formed at preparation of a film, and a silicon oxide film can be manufactured at a high adhesion. And, a material and film manufacturing conditions to be used can be selected so that an atomic ratio in a manufactured silicon oxide film is in a range of Si:O:C=100:160 to 190:30 to 50, a peak position of infrared-ray absorption due to Si—O—Si stretching vibration is between 1030 to 1060 cm$^{-1}$, a film density is in a range of 2.5 to 2.7 g/cm$^3$, preferably 2.6 to 2.7 g/cm$^3$, and a distance between grains is 30 nm or smaller, preferably in a range of 10 to 30 nm, more preferably 10 to 20 nm.

In addition, in the case of the above-mentioned barrier films 11 and 21 provided with a resin layer as shown in FIG. 2 and FIG. 3, formation of a resin layer can be performed by a dry forming method by a physical deposition method such as previously known vacuum deposition, sputtering, ion plating and the like, a chemical vapor deposition (CVD) method and the like, or a wet forming method of coating by a coating method such as roll coating, gravure coating, knife coating, dipping coating, spray coating and the like, thereafter, drying to remove a solvent and a diluent. A forming method can be appropriately selected depending on a material to be used. Still more, by forming a resin layer by an ion plating method, formation of a barrier layer and formation of a resin layer may be performed by in-line in the same film manufacturing apparatus.

In a method for manufacturing a barrier film of the second embodiment of the present invention, a barrier layer is formed by an ion plating method. As an ion plating method, any of a hollow cathode type ion plating method, a hollow anode type ion plating method and others are used. A film is manufactured in the presence of a nitrogen gas, or in the presence of a nitrogen gas and an oxygen gas using silicon having a sintered density of 80% or greater, or silicon oxide having a sintered density of 80% or greater, as a film forming material. By rendering a density of a film forming material 80% or greater, it becomes possible to form an elaborated silicon oxi-nitride film. In addition, since forming a film by the above-mentioned ion plating method is a reactive forming of film, processed under presence of a nitrogen gas, or under presence of a nitrogen gas and an oxygen gas, control of nitriding degree or oxidation degree is easy and, further, by rendering a distance between a film forming material and a material on which a film is to be formed, and an input electric power adequate, suitable etching is generated in a material on which a film is to be formed at preparation of a film, and a silicon oxi-nitride film can be manufactured at a high adhesion. And, a material and film manufacturing conditions to be used can be selected so that an atomic ratio in a manufactured silicon oxi-nitride film is in a range of Si:O:N:C=100:80 to 110:40 to 70:30 to 50, a maximum peak of infrared-ray absorption due to Si—O stretching vibration and Si—N stretching vibration in a range of 900 to 1000 cm$^{-1}$, a film density is in a range of 2.7 to 3.0 g/cm$^3$, preferably 2.8 to 3.0 g/cm$^3$, and a distance between grains is 30 nm or smaller, preferably in a range of 10 to 30 nm, more preferably 10 to 20 nm.

In addition, in the case of the above-mentioned barrier films 11 and 21 provided with a resin layer as shown in FIG. 2 and FIG. 3, formation of a resin layer can be performed by a dry forming method by a physical deposition method such as previously known vacuum deposition, sputtering, ion plating and the like, a chemical vapor deposition (CVD) method and the like, or a wet forming method of coating by a coating method such as roll coating, gravure coating, knife coating, dipping coating, spray coating and the like, thereafter, drying to remove a solvent and a diluent. A forming method can be appropriately selected depending on a material to be used. Still more, by forming a resin layer by an ion plating method, formation of a barrier layer and formation of a resin layer may be performed by in-line in the same film manufacturing apparatus.

Laminated Material

Next, a laminated material of the present invention will be explained.

Figure 4:
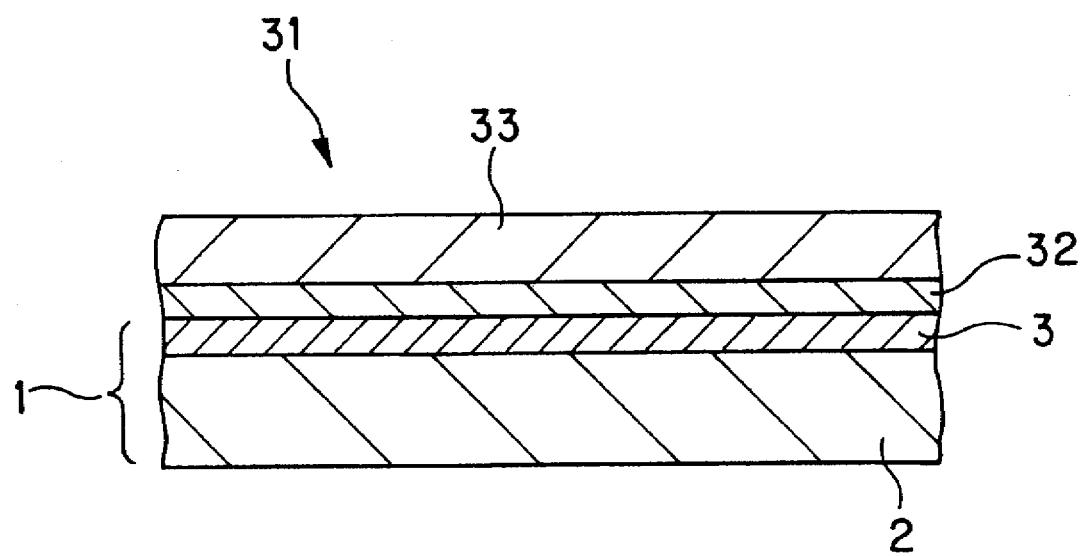
FIG. 4 is a schematic cross-sectional view showing one embodiment of a laminated material using a barrier film of the present invention.

FIG. 4 is a schematic cross-sectional view showing an embodiment of a laminated material of the present invention using the above-mentioned barrier film 1 of the present invention. In FIG. 4, a laminated material 31 is provided with a barrier film 1 which is provided with a barrier layer 3 on one surface of a substrate film 2, and a heat sealable resin layer 33 formed on a barrier layer 3 of this barrier film 1 via an anchor coating agent layer and/or an adhesive layer 32.

An anchor coating agent layer 32 constituting a laminated material 31 can be formed, for example, by using an organic titanium series anchor coating agent such as alkyl titanate and the like, an isocianate series anchor coating agent, a polyethyleneimine series anchor coating agent, a polybutadiene series anchor coating agent or the like. An anchor coating agent layer 32 can be formed by coating the above-mentioned anchor coating agent, for example, by the known coating method such as roll coating, gravure coating, knife coating, dipping coating, spray coating and the like, and drying to remove a solvent, a diluent and the like. As an amount of the above-mentioned anchor coating agent to be coated, around 0.1 to 5 g/m$^2$ (dry state) is preferable.

In addition, an adhesive layer 32 constituting a laminated material 31 can be formed, for example, by using various laminating adhesives such as solution type, aqueous type, non-solvent type and heat melting type which contain, as a main component, a vehicle such as polyurethane series, polyester series, polyamide series, epoxy series, poly(meth)acrylic series, polyvinyl acetate series, polyolefin series, casein, wax, ethylene-(meth)acrylic acid copolymer, polybutadiene series and the like. An adhesive layer 32 can be formed by coating the above-mentioned laminating adhesive, for example, by a coating method such as roll coating, gravure coating, knife coating, dipping coating, spray coating and the like, and drying to remove a solvent, a diluent and the like. As an amount of the above-mentioned laminating adhesive to be coated, around 0.1 to 5 g/m$^2$ (dry state) is preferable.

Examples of a heat sealable resin used in a heat sealable resin layer 33 constituting a laminated material 31 include resins which are melted by heat and can be anastomosed to each other. Specifically, acid denaturated polyolefin resins, polyvinyl acetate series resins, poly(meth)acrylic resins, polyvinyl chloride series resins and the like obtained by denaturating polyolefin series resins such as low density polyethylene, intermediate density polyethylene, high density polyethylene, straight chain (linear) low density polyethylene, polypropylene, ethylene-vinyl acetate copolymer, ionomer resin, ethylene-acrylic aid copolymer, ethylene-methacrylic acid copolymer, ethylene-methyl methacrylate copolymer, ethylene-propylene copolymer, methylpentene polymer, polybutene polymer, polyethylene, polypropylene and the like with unsaturated carboxylic acid such as acrylic acid, methacrylic acid, maleic acid, maleic anhydride, fumaric acid, itaconic acid and the like can be used. The heat sealable resin layer 33 may be formed by coating the above-mentioned heat sealable resin, or may be formed by laminating a film or a sheet comprising the above-mentioned heat sealable resin. A thickness of such the heat sealable resin layer 33 can be set in a range of 5 to 300 µm, preferably 10 to 100 µm.

Figure 5:
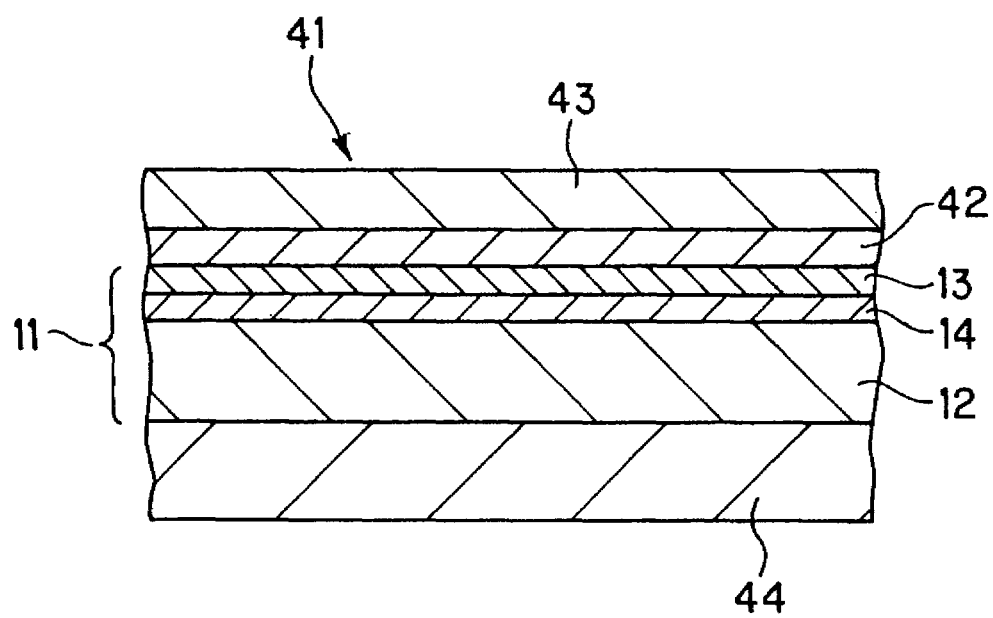
FIG. 5 is a schematic cross-sectional view showing another embodiment of a laminated material using a barrier film of the present invention.

FIG. 5 is a schematic cross-sectional view showing an embodiment of a laminated material of the present invention using the above-mentioned barrier film 11 of the present invention. In FIG. 5, a laminated material 41 is provided with a barrier film 11 which is provided with a barrier layer 13 on one surface of a substrate film 12 via a resin layer 14, a heat sealable resin layer 43 formed on this barrier layer 13 of a barrier film 11 via an anchor coating agent layer and/or an adhesive layer 42, and a substrate 44 provided on the other surface (resin layer non-forming surface) of a substrate film 12 of a barrier film 11.

An anchor coating agent layer, an adhesive layer 42 and a heat sealable layer 43 constituting a laminated material 41 may be the same as the anchor coating layer, the adhesive layer 32 and the heat sealable resin layer 33 constituting the above-mentioned laminated layer 31 and, therefore, explanation thereof will be omitted.

As a substrate 44 constituting a laminated material 41, for example, when a laminated material 41 constitutes a container for wrapping, since a substrate 44 is to be a fundamental material, a film or a sheet of a resin having the excellent mechanical, physical, chemical and other properties, in particular, having the strength and the toughness, and heat resistance can be used. Examples thereof include oriented (mono-axial or biaxial) or non-oriented films or sheets of tough resins such as a polyester series resin, a polyamide series resin, a polyaramid series resin, a polyolefin series resin, a polycarbonate series resin, a polystyrene series resin, a polyacetal series resin, a fluorine series rein and the like. It is desirable that a thickness of this substrate 44 is 5 to 100 μm, preferably around 10 to 50 μm.

In addition, in the present invention, for example, front face printing or rear face printing of a desired printing design such as letter, figure, symbol, design, pattern and the like may be imparted to a substrate 44 by the conventional printing method. Such the letter and the like can be recognized visually through a barrier film 11 constituting a laminated material 41.

Figure 6:
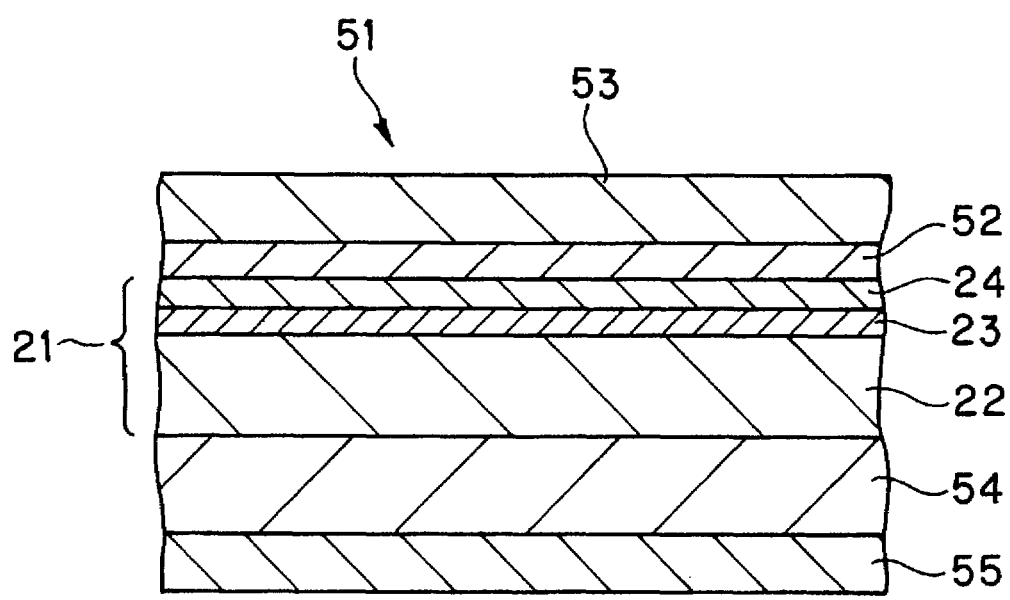
FIG. 6 is a schematic cross-sectional view showing another embodiment of a laminated material using a barrier film of the present invention.

FIG. 6 is a schematic cross-sectional view showing an embodiment of a laminated material of the present invention using the above-mentioned barrier film 21 of the present invention. In FIG. 6, a laminated material 51 is provided with a barrier film 21 in which a barrier layer 23 and a resin layer 24 are laminated in this order on one surface of a substrate film 22, a heat sealable resin layer 53 formed on a resin layer 24 of this barrier film 21 via an anchor coating agent layer and/or an adhesive layer 52, a substrate 54 which is provided on the other surface (barrier layer non-forming surface) of a substrate film 22 of a barrier film 21, and a heat sealable resin layer 55 formed on this substrate 54.

An anchor coating agent layer, an adhesive layer 52 and heat sealable resin layers 53 and 55 constituting a laminated material 51 may be the same as the anchor coating agent layer, the adhesive layer 32 and the heat sealable resin layer 33 constituting the above-mentioned laminated material 31, and a substrate 54 constituting a laminated material 51 may be the same as the substrate 44 constituting above-mentioned laminated material 41 and, therefore, the explanation thereof will be omitted.

In addition, in the laminated material of the present invention, further, for example, films or sheets of resins having the barrier property to water vapor, water and the like such as low density polyethylene, intermediate density polyethylene, high density polyethylene, straight chain low density polyethylene, polypropylene, ethylene-propylene copolymer and the like, films or sheets of resins having the barrier property to oxygen, water vapor and the like such as polyvinyl alcohol, saponified ethylene-vinyl acetate copolymer and the like, or films or sheets of various colored resins having the light shielding property obtained by adding a colorant such as a pigment and the like, and other desired additives to a resin, kneading them, and converting this into a film, may be used.

These materials may be used alone or by combining two or more kinds, and a thickness there of is arbitrary, but is usually 5 to 300 μm, preferably around 10 to 200 μm.

Further, when the laminated material of the preset invention is used in utility of a container for wrapping, since the container for wrapping is usually placed under the physical and chemical severe conditions, the severe wrapping suitability is required also for a laminated material. Specifically, various conditions such as the deformation preventing strength, the falling impact strength, the resistance to pin hole, the resistance to heat, the sealability, the quality preserving property, the workability, the hygiene property and others are required and, for this reason, in the laminated material of the present invention, materials satisfying the above-mentioned various conditions may be arbitrarily selected and used as substrate films 2, 12 and 22, substrates 44 and 54, or other constituent members. Specifically, materials may be used by arbitrarily selecting from films or sheets of the known resins such as low density polyethylene, intermediate density polyethylene, high density polyethylene, linear low density polyethylene, polypropylene, ethylene-propylene copolymer, ethylene-vinyl acetate copolymer, ionomer resin, ethylene-ethyl acrylate copolymer, ethylene-acrylic acid or methacrylic acid copolymer, methylpentene polymer, polybutene series resin, polyvinyl chloride series resin, polyvinyl acetate series resin, poly(meth)acrylic series resin, polyacrylonitrile series resin, polystyrene series resin, acrylonitrile-styrene copolymer (AS series resin), acrylonitrile-butadiene-styrene copolymer (ABS series resin), polyester series resin, polyamide series resin, polycarbonate series resin, polyvinyl alcohol series resin, saponified ethylene-vinyl acetate copolymer, fluorine series resin, diene series resin, polyacetal series resin, polyurethane series resin, nitrocellulose and the like. Besides, for example, films such as cellophane and the like may be used.

As the above-mentioned film or sheet, any films or sheets which are non-oriented, or monoaxially or biaxially oriented may be used. A thickness thereof is arbitrary, but may be selected and used from a range of around a few μm to 300 μm, and a laminating position is not particularly limited. In addition, in the present invention, the above-mentioned film and sheet may be a membrane having any nature such as an extruded membrane, an inflated membrane and coated membrane.

The laminated material of the present invention such as the above-mentioned laminated materials 31, 41 and 51 can be manufactured by using a method for laminating a normal wrapping material, for example, a wet lamination method, a dry lamination method, a non-solvent type dry lamination method, an extrusion lamination method, a T die extrusion molding method, a coextrusion lamination method, an inflation method, a coextrusion inflation method and the like.

Upon the above-mentioned lamination, if necessary, a film can be subjected to pre-treatment such as corona treatment, ozone treatment and the like. In addition, anchor coating agents such as isocyanate series (urethane series), polyethyleneimine series, polybutadiene series, organic titanium series and the like, or the known adhesives such as laminating adhesives such as polyurethane series, polyacrylic series, polyester series, epoxy series, polyvinyl acetate series, cellulose series and the like can be used.

A combination of barrier films of the present invention used in the laminated material of the present invention is not limited to examples shown in the above-mentioned laminated materials 31, 41 and 51, but may be appropriately set depending on intended use of a laminated material.

Container for Wrapping

Next, a container for wrapping of the present invention will be explained.

A container for wrapping of the present invention is obtained by making a bag or a can by heat anastomosing by using the laminated material of the present invention.

Specifically, when a container for wrapping is a soft wrapping bag, container for wrappings having a variety forms relating to the present invention can be manufactured by folding a heat sealable resin layer of a laminated material of the present invention facing to each other, or piling two laminated materials of the present invention, and heat anastomosing a peripheral edge part thereof in the heat seal form such as side sealing type, two-way sealing type, there-way sealing type, four-way sealing type, envelope making sealing type, butt seaming type (pillow sealing type), ribbed sealing type, flat bottom sealing type, square bottom sealing type, and others, to form a sealed part.

In the above case, heat anastomosing can be performed by the known method such as bar sealing, rotating roll sealing, belt sealing, impulse sealing, high frequency wave sealing, ultrasound sealing and the like.

Figure 7:
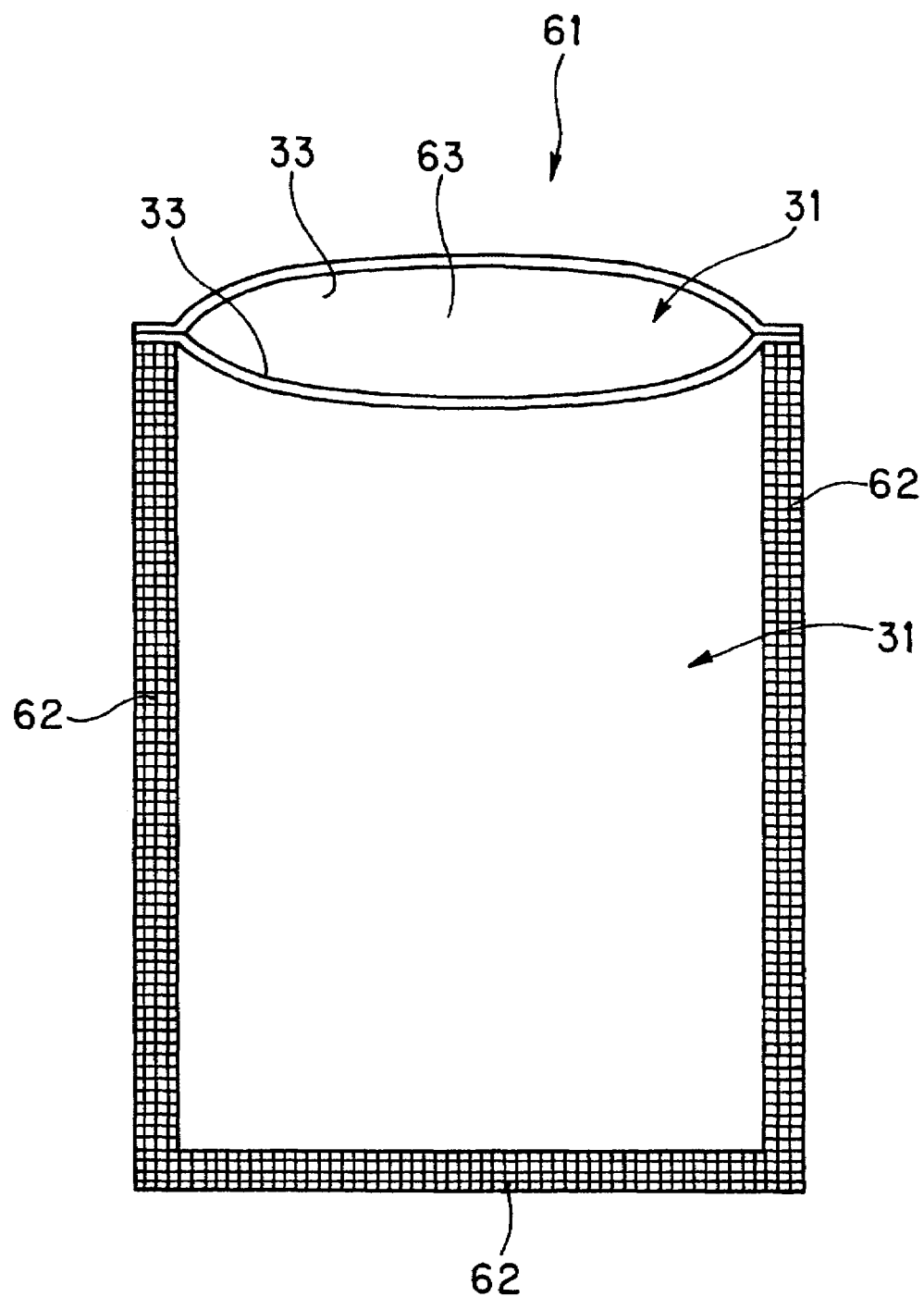
FIG. 7 is a perspective view showing one embodiment of a container for wrapping using a barrier film of the present invention.

FIG. 7 is a perspective view showing one embodiment of the above-mentioned container for wrapping of the present invention. In FIG. 7, a container for wrapping 61 is formed by piling one set of laminated materials 31 of the present invention so that the heat sealable resin layers 33 are facing to each other, and performing heat anastomosing to form sealed part 62 in three ways at a peripheral part in this state. This container for wrapping 61 can be filled with the content through an opening 63 formed on remaining one way at a peripheral part. And, after the content is filled therein, the opening 63 is heat anastomosed to form a sealed part, whereby, a container for wrapping in which the content is filled and packed, is obtained.

A container for wrapping of the present invention may be in the form of, for example, a self-supporting wrapping bag (standing pouch) in addition to the above-mentioned form and, further, a tubular container may be manufactured by using a laminated material of the present invention.

In addition, in the present invention, an filling port such as one-piece type, two-piece type and other type, or an opening and closing zipper may be arbitrarily attached to the above-mentioned container for wrapping.

Still more, a container for wrapping of the present invention may be manufactured into container for a liquid such as brick type, flat type and gable top type by making a blank plate for manufacturing a desired container using a laminated material of the present invention, and forming a shell part, a bottom part and a head part employing this blank plate. In addition, as a shape thereof, any shape such as square container, cylindrical can such as round shape, and the like can be manufactured.

Figure 8:
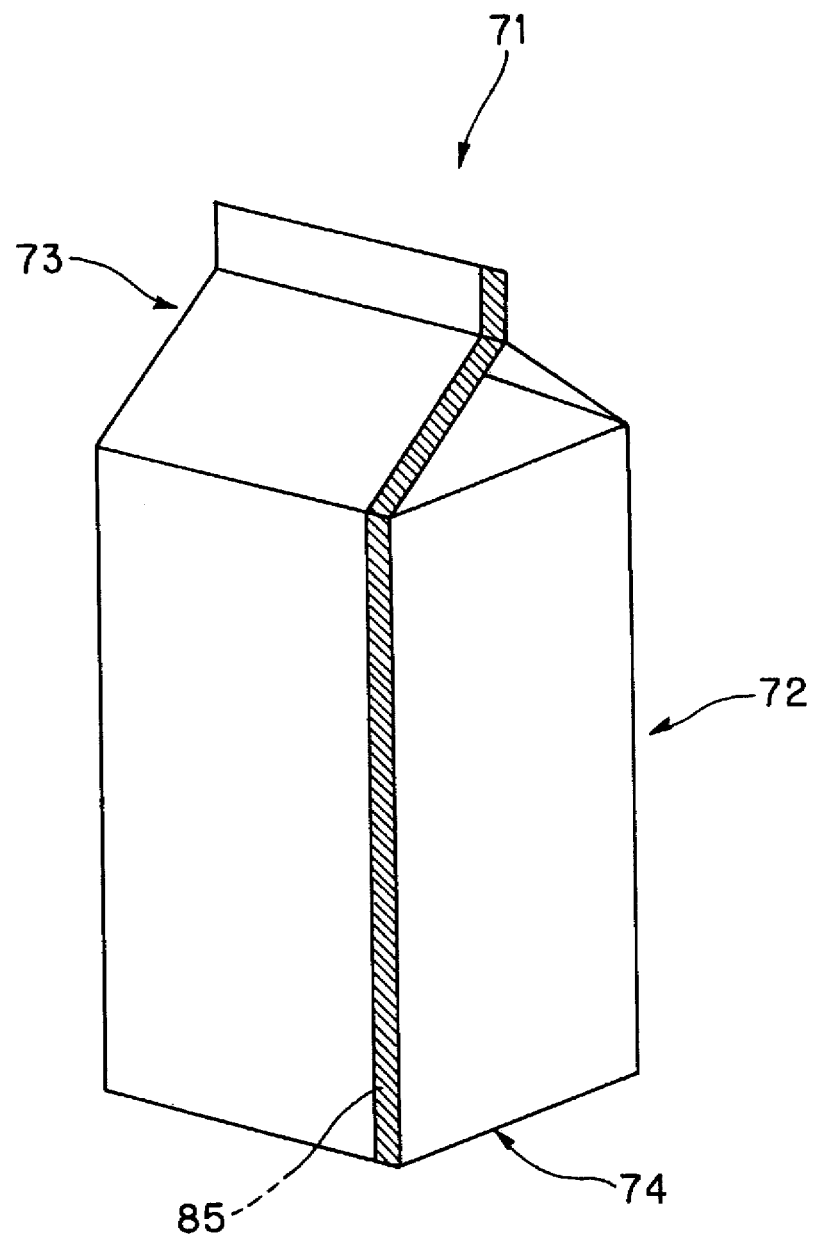
FIG. 8 is a perspective view showing another embodiment of a container for wrapping using a barrier film of the present invention.
Figure 9:
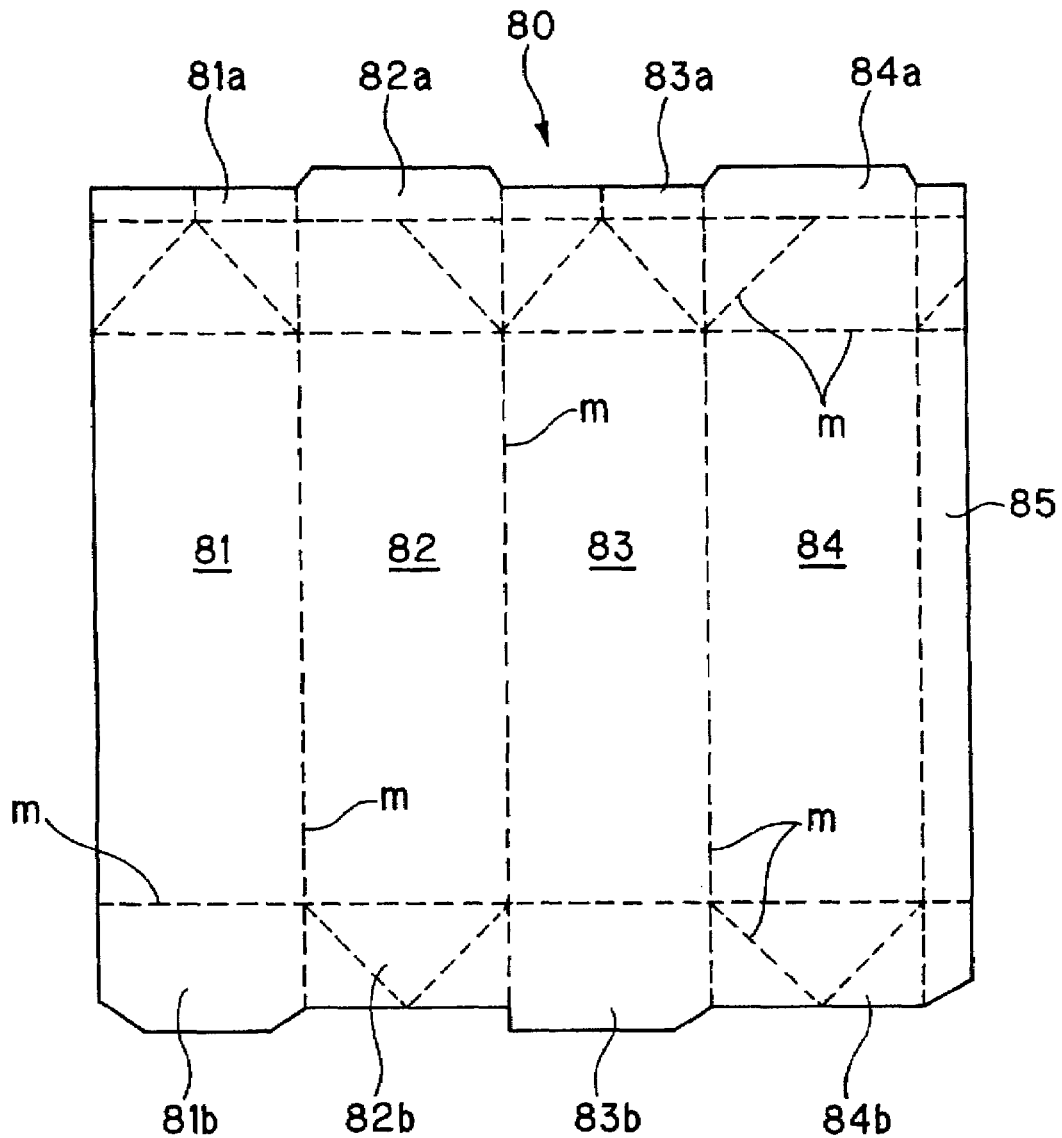
FIG. 9 is a plane view of a blank plate used in manufacturing the container for wrapping shown in FIG. 8.

FIG. 8 is a perspective view showing one embodiment of the above-mentioned liquid filling paper container which is a container for wrapping of the present invention, and FIG. 9 is a plane view of the blank plate used in the container for wrapping shown in FIG. 8. A blank plate 80 is manufactured by using a laminated material 51 of the present invention shown in FIG. 6 and punching out the material so that the plate is provided with a pressing line m, m . . . for bending processing in formation of a container, shell panels 81, 82, 83 and 84 constituting a shell part 72 of a container 71, top panels 81a, 82a, 83a and 84a constituting a top part 73 of a container 71, bottom panels 81b, 82b, 83b and 84b constituting a bottom part 74 of a container 71, and a panel for heat anastomosing 85 for forming a cylinder. This blank plate 80 can be processed into a container for wrapping 71 which liquid is filled and packed bending the plate along a pressing line m, m . . . , heat an astomosing an inner side of an end of a shell panel 81 and an outer side of a panel for heat anastomosing 85 to form a cylinder, thereafter, bending bottom panels 81b, 82b, 83b and 84b along a pressing line m, m . . . and heat anastomosing the panels, then filling this with liquid through an opening at a top part, bending top panels 81a, 82a, 83a and 84a along a pressing line m, m . . . and heat anastomosing the panels.

The container for wrapping of the present invention can be used in a variety of goods such as various foods and beverages, chemicals such as adhesives, pressure-sensitive adhesives and the like, cosmetics, medical supply, miscellaneous goods such as chemical warmer and the like, and others.

Laminated Material

Next, other embodiments of the laminated material of the present invention will be explained by way of examples using the above-mentioned barrier film 1 of the present invention.

Figure 10:
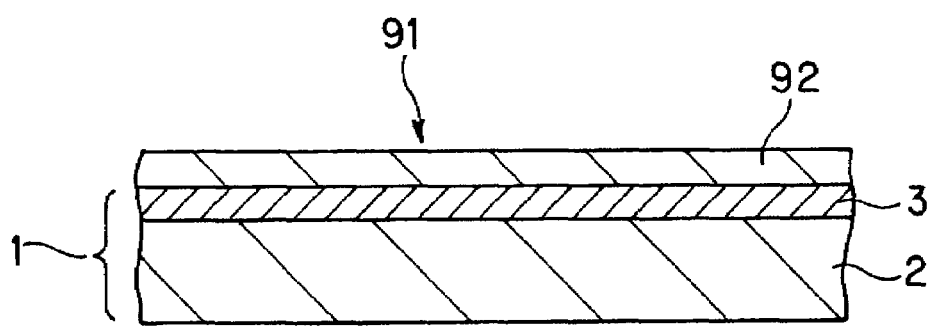
FIG. 10 is a schematic cross-sectional view showing another embodiment of a laminated material using a barrier film of the present invention.

FIG. 10 is a schematic cross-sectional view showing other embodiment of the laminated material of the present invention. In FIG. 10, a laminated material 91 is provided with a barrier film 1 which is provided with a barrier layer 3 on one surface of a substrate film 2, and a conductive layer 92 formed on a barrier layer 3 of this barrier film 1.

A conductive layer 92 constituting a laminated material 91 may be a transparent conductive film such as indium tin oxide (ITO) film. The ITO film can be formed by a sputtering method, a PVD method, an ion plating method or the like and, in particular, since the ITO film formed by a sputtering method is excellent in the inplane uniformity of the conductivity, it is preferably used.

A film thickness of a conductive layer 92 can be appropriately set depending on a material thereof, use of a laminated material 91 and the like, and is usually set in a range of 100 to 200 nm. In addition, it is preferable that a conductive layer 92 has a surface resistance value of 0 to 50Ω/□ and an overall transmittance of 85% or greater.

Such the conductive layer 92 can be used as a transparent electrode for driving a liquid crystal, for example, in the case of a liquid crystal displaying a device.

Image Displaying Medium

An image displaying medium of the present invention uses the above-mentioned laminated material 91 as a substrate and is provided with an image displaying layer on a conductive layer 92.

Examples of such the image displaying medium include non-light emitting type displays for performing display by shutting out the brightness of backlight to produce gradation as in a liquid crystal displaying apparatus, and self-light emitting type displays for performing display by making fluorescent compounds emit with some energy, such as plasma display panel (PDP), field emission display (FED), and electroluminescence display (EL).

When the image displaying medium of the present invention is a liquid crystal displaying apparatus, the above-mentioned image displaying layer indicates a liquid crystal layer and, when the medium is a self-light emitting type display, a fluorescent compound layer having a fluorescent compound corresponds to above-mentioned image displaying layer.

The present invention is not limited by the above-mentioned respective embodiments.

EXAMPLES

The present invention will be explained in more detail by way of Examples below.

Example 1

Preparation of Barrier Film

Figure 11:
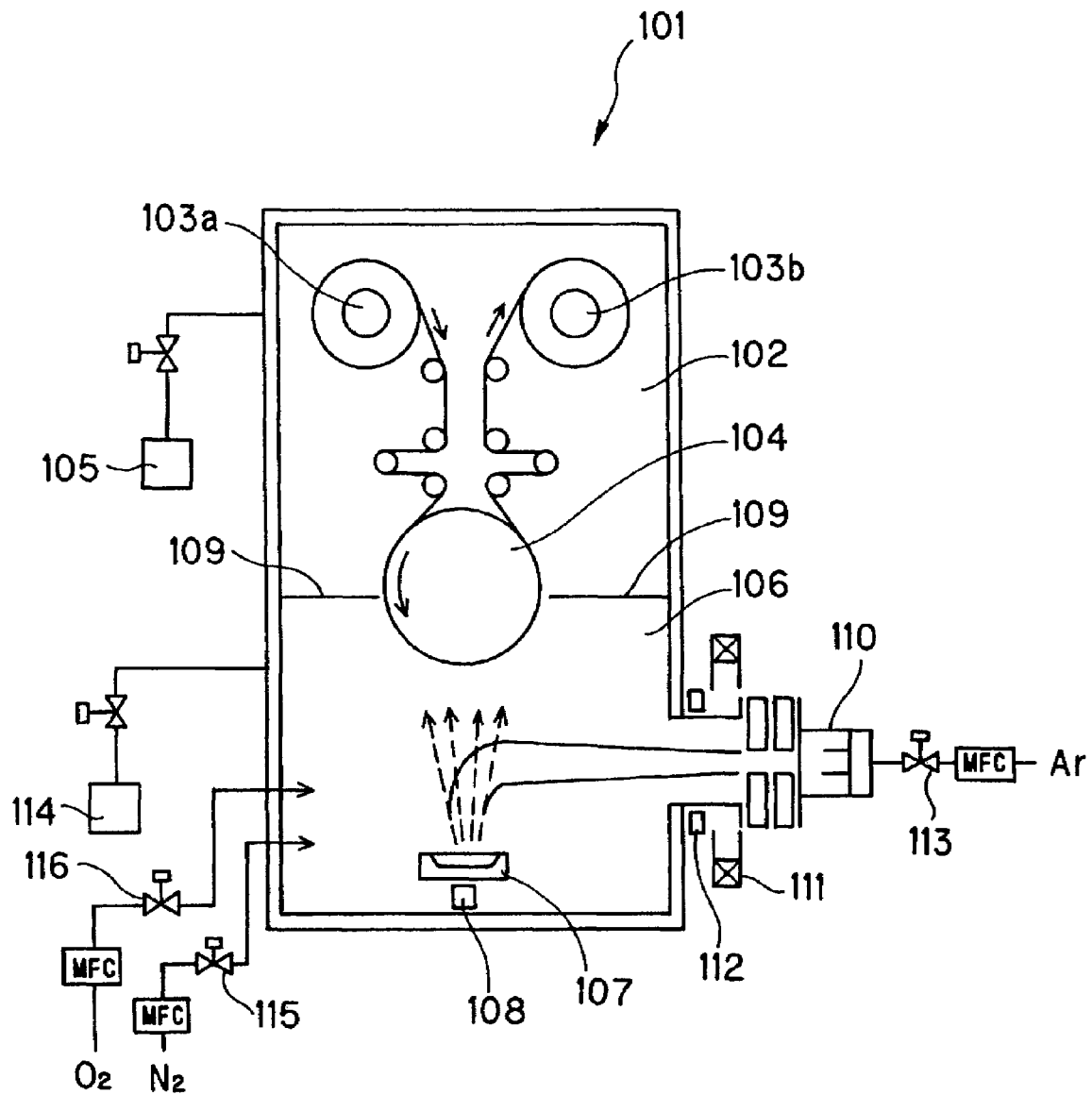
FIG. 11 is a schematic view showing a configuration of a hollow cathode type ion plating apparatus used in examples.

As a substrate film, a wound up-like biaxially oriented polyethylene terephthalate film (PET film A4100 manufactured by Toyobo Co., Ltd., thickness 100 µm) having a width of 30 cm was prepared, and was mounted in a chamber 102 of a winding up type hollow cathode type ion plating apparatus 101 equipped with a pressure gradient-type plasma gun shown in FIG. 11 so that a corona-untreated surface side of this substrate film was a surface on which a film is to be formed. This ion plating apparatus 101 is provided with a vacuum chamber 102, a supplying roll 103a for supplying a substrate film, a winding up roll 103b and a coating drum 104 for which are arranged in this vacuum chamber 102, a vacuum evacuating pump 105 connected to the vacuum chamber 102 via a valve, a diaphragm 109, a filmmaking chamber 106 which is isolated from a vacuum chamber 102 with the diaphragm 109, a crucible 107 arranged at a lower part of this filmmaking chamber 106, an anode magnet 108, a pressure gradient-type plasma gun 110 arranged at a prescribed position (in the example shown in the FIG. 11, a right side wall of a film making chamber) of a filmmaking chamber 106, a convergent coil 111, a sheeted magnet 112, a valve 113 for adjusting an amount of an argon gas to be supplied to a pressure gradient-type plasma gun 110, a vacuum evacuating pump 114 connected to a film making chamber 106 via a valve, and a valve 116 for adjusting an amount of an oxygen gas to be supplied.

Then, $SiO_2$ having a sintered density of 90%, as a film making material, was placed into a crucible 107. A distance (between target material and substrate; TS distance) between this film making material and a substrate film was set at 50 cm.

Then, as a gas to be added at film formation, an oxygen gas (manufactured by Taiyo Toyo Sanso Co., Ltd. (purity 99.9995% or higher)) and an argon gas (manufactured by Taiyo Toyo Sanso Co., Ltd. (purity 99.9999% or higher)) were prepared.

Then, a pressure in chambers 102 and 106 was reduced to ultimate vacuum of $1.0\times10^{-3}$ Pa with vacuum evacuating pumps 105 and 114. Then, an oxygen gas was introduced into a chamber 106 at a flow rate of 20 sccm, an internal pressure in a chamber was retained at 0.1 Pa by controlling an opening and closing degree of a valve between a vacuum evacuating pump and a chamber, a substrate film was run, an electric power of 9 kW for producing plasma was input into a pressure gradient-type plasma gun 110 into which an argon gas had been introduced at a flow rate of 20 sccm, vaporizing a film forming material by converging into a crucible 107 on an anode magnet 108 and irradiating, ionizing vapor molecules by high density plasma, to form a barrier layer comprising a silicon oxide film on a substrate film, to obtain a barrier film (Example 1-1). A running rate of a substrate film was set so that a film thickness of a formed silicon oxide film became 100 nm. In addition, sccm is an abbreviation of standard cubic centimeter per minute, and is the same also in examples and comparative examples below.

Components of the silicon oxide film formed in the above were measured under the following conditions, and results are shown in following Table 1.

Measurement of Components of Silicon Oxide Film

Components were measured with ESCA (ESCA LAB 220i-XL manufactured by VG Scientific, England). As a X-ray source, a monochromic Al X-ray source having the Ag-3d-5/2 peak strength of 300 Kcps to 1 Mcps, and a slit having a diameter of about 1 mm were used. Measurement was performed in the state where a detector was set on a normal line of a sample surface to be measured, and adequate electrification correction was made. Analysis after measurement was performed by using software Eclipse version 2.1 attached to the above-mentioned ESCA apparatus and using peaks corresponding to the binding energies of Si: 2p, C: 1s, O: 1s. Upon this, regarding each peak, Shirley's background removal was performed, and sensitivity coefficient correction was performed on each atom (based on C=1, Si=0.817, O=2.930) regarding each peak area, and an atomic ratio was obtained. Regarding the resulting atomic ratio, letting a number of Si atoms to be 100, numbers of O and C atoms which are other components were calculated, and was used as a component ratio.

In addition, an infrared-ray absorbing band region due to Si—O—Si stretching vibration, a film density and a distance between grains of a silicon oxide film formed as described above were measured under the following conditions, respectively, and the results are shown in following Table 1.

Measurement of Infrared Absorbing Spectrum

The spectrum was measured using a Fourier transform infrared spectrometer (Herschel FT-IR-manufactured by JASCO Corporation) equipped with a multiple reflection (ATR) measuring apparatus (ATR-300/H manufactured by JASCO Corporation).

Measurement was performed using a germanium crystal as a prism at an incident angle of 45°.

Measurement of Film Density

A film density was measured using a X-ray reflectivity measuring apparatus (ATX-E manufactured by Rigaku Corporation) as follows: That is, as a X-ray source, a 18 kW X-ray generating apparatus and CuKa wavelength λ=1.5405 Å of Cu target was used and, as a monochrometer, a parabolic artificial multi-layered film mirror and Ge(220) monochromic crystal were used. In addition, the setting conditions were scanning rate: 0.1000°/min, sampling width: 0.002°, and scanning range; 0 to 4.0000°. Further, a sample was mounted on a substrate folder with a magnet, and 0° positional adjustment was performed by the automatic alignment function of the apparatus. Thereafter, a reflectivity was measured under the above-mentioned setting conditions. The resulting measured reflectivity values were analyzed under the conditions of fitting area: 0.4° to 4.0° using an analysis software (RGXR) attached to the above-mentioned X-ray reflectivity measuring apparatus. Upon this, a ratio of atoms (Si:O=1:2) of a thin film was input as a fitting initial value. A reflectivity was fitted by a non-linear minimum square method to calculate a film density.

Measurement of Distance Between Grains

A distance between grains was measured using an area of 500 nm×500 nm as a surface shape in a tapping mode using Nano Scope III manufactured by Digital Instrument as an atom force microscopy (AFM). After the resulting AFM image was subjected to flat treatment, an arbitral cross-section was observed, regarding two adjacent grains having approximately same peak heights, a distance between those peaks was measured. In addition, in measurement, a uniform irregular region having no remarkable recess or projection was measured using a cantilever in the state where there is no abrasion or stain. The above-mentioned tapping mode is as explained by Zong et al., in Surface Science Letter, 1993, vol. 290, L688-690, and this is a method of performing shaking a cantilever having a probe at its tip in the vicinity of a resonance frequency (about 50-500 MHz) using a piezoshaker, and scanning a sample while slightly touching the surface of a sample intermittently, and a method of measuring a two-dimensional surface shape in which a position of a cantilever was moved in an irregular direction (Z direction) so that a change in a detected amplitude was maintained constant, and a signal based on movement in this Z direction and a signal in a flat plane direction (XY direction). In addition, the above-mentioned flat treatment is to treat correction of a gradient with one-dimensional, a two-dimensional or three-dimensional function for a standard plane regarding two-dimensional data, and waviness of an entire plane was offset by this treatment.

Then, according to the same manner as that of Example 1-1 except that a film forming material, or the film forming conditions (oxygen gas flow rate, TS distance, input electric power, a film forming pressure) were set as shown in following Table 1 and Table 2, silicon oxide films were formed to manufacture barrier films (Examples 1-2 to 1-6, Comparative Examples 1-1 to 1-11). Regarding silicon oxide films of these barrier films, components, an infrared-ray absorbing band due to Si—O—Si stretching vibration, a film density and a distance between grains were measured as in Example 1-1, and the results are shown in following Table 1 and Table 2.

(Measurement of Barrier Property)

Regarding the thus manufactured barrier films (Examples 1-1 to 1-6, Comparative Examples 1-1 to 1-11), an oxygen transmission rate and a water vapor transmission rate were measured under the following conditions, and the results are shown in following Table 1 and Table 2.

Measurement of Oxygen Transmission Rate

An oxygen transmission rate was measured under the conditions with Individual Zero Measurement in which background removal measurement was performed, at a temperature of 23° C. and a humidity of 90% RH, using an oxygen gas transmission measurement apparatus (OX-TRAN 2/20 manufactured by MOCON).

Measurement of Water Vapor Transmission Rate

A water vapor transmission rate was measured at a temperature of 40° C. and a humidity of 100% RH using a water vapor transmission rate measuring apparatus (PERMATRAN-W 3/31 manufactured by MOCON).

To the contrary, as shown in Table 2, none of barrier films (Comparative Examples 1-1 to 1-11) provided with, as a barrier layer, a silicon oxide film having at least one of, an atomic ratio, an infrared-ray absorbing band region due to Si—O—Si stretching vibration, a film density and a distance between grains which are outside of the above-mentioned ranges had the excellent barrier property (an oxygen transmission rate is 0.1 cc/m$^2$/day·atm or smaller, a water vapor transmission rate is 0.1 g/m$^2$/day or smaller).

Example 2

Preparation of Barrier Film

As a substrate film, a wound up-like biaxially oriented polyethylene terephthalate film (PET film A4100 manufactured by Toyobo Co., Ltd., thickness 100 μm) having a width of 30 cm was prepared, and was mounted in a chamber 102 of

TABLE 1

| | | Film making conditions | | | | | Silicon oxide film | | | | Barrier property | |
| | | | | | | | | | | | Oxygen | |
| | Film making material | | | | Input | | Si—O—Si | | | Distance | transmission | Water vapor |
| | | Oxygen | | | elec. | | peak | Atomic | Film | between | rate | transmission |
| Barrier film | Material | Density (%) | flow rate (sccm) | TS distance (cm) | power (kW) | Pressure (Pa) | position (cm$^{-1}$) | ratio Si:O:C | density (g/cm$^3$) | grains (nm) | (cc/m$^2$/day · atm) | rate (g/m$^2$/day) |
|---|---|---|---|---|---|---|---|---|---|---|---|---|
| Ex. 1 | SiO$_2$ | 90 | 5 | 50 | 6 | 0.1 | 1050 | 100:171:40 | 2.7 | 25 | 0.03 | 0.07 |
| Ex. 2 | SiO | 90 | 10 | 50 | 6 | 0.1 | 1046 | 100:172:43 | 2.7 | 26 | 0.05 | 0.04 |
| Ex. 3 | Si | 90 | 20 | 50 | 6 | 0.1 | 1042 | 100:178:47 | 2.7 | 24 | 0.04 | 0.02 |
| Ex. 4 | SiO | 90 | 5 | 50 | 6 | 0.1 | 1030 | 100:163:35 | 2.5 | 29 | 0.08 | 0.09 |
| Ex. 5 | SiO | 90 | 10 | 50 | 6 | 0.1 | 1060 | 100:188:48 | 2.7 | 28 | 0.05 | 0.05 |
| Ex. 6 | SiO$_2$ | 90 | 3 | 50 | 6 | 0.1 | 1038 | 100:175:30 | 2.6 | 28 | 0.07 | 0.06 |

TABLE 2

| | | Film making conditions | | | | | Silicon oxide film | | | | Barrier property | |
| | | | | | | | | | | | Oxygen | |
| | Film making material | Oxygen | | Input | | | Si—O—Si | | | Distance | transmission | Water vapor |
| | | flow | TS | elec. | | | peak | Atomic | Film | between | rate | transmission |
| Barrier film | Material | Density (%) | rate (sccm) | distance (cm) | power (kW) | Pressure (Pa) | position (cm$^{-1}$) | ratio Si:O:C | density (g/cm$^3$) | grains (nm) | (cc/m$^2$/day · atm) | rate (g/m$^2$/day) |
|---|---|---|---|---|---|---|---|---|---|---|---|---|
| Comp. Ex. 1 | SiO$_2$ | 90 | 0 | 50 | 6 | 0.1 | 1034 | 100:169:18 | 2.6 | 32 | 0.13 | 0.15 |
| Comp. Ex. 2 | SiO$_2$ | 90 | 20 | 50 | 6 | 0.1 | 1064 | 100:182:55 | 2.7 | 38 | 0.45 | 0.37 |
| Comp. Ex. 3 | SiO$_2$ | 90 | 5 | 70 | 6 | 0.1 | 1050 | 100:175:25 | 2.6 | 29 | 0.15 | 0.41 |
| Comp. Ex. 4 | SiO$_2$ | 90 | 5 | 35 | 6 | 0.1 | 1054 | 100:165:63 | 2.8 | 45 | 0.32 | 0.69 |
| Comp. Ex. 5 | SiO$_2$ | 90 | 5 | 50 | 9 | 0.1 | 1050 | 100:170:52 | 2.7 | 25 | 0.15 | 0.17 |
| Comp. Ex. 6 | SiO$_2$ | 90 | 5 | 50 | 4 | 0.1 | 1042 | 100:162:33 | 2.4 | 32 | 0.14 | 0.82 |
| Comp. Ex. 7 | SiO$_2$ | 70 | 5 | 50 | 6 | 0.1 | 1042 | 100:153:39 | 2.4 | 33 | 0.25 | 0.13 |
| Comp. Ex. 8 | SiO | 70 | 10 | 50 | 6 | 0.1 | 1046 | 100:162:44 | 2.4 | 37 | 0.27 | 0.15 |
| Comp. Ex. 9 | Si | 70 | 20 | 50 | 6 | 0.1 | 1042 | 100:166:48 | 2.4 | 36 | 0.32 | 0.17 |
| Comp. Ex. 10 | SiO$_2$ | 90 | 5 | 50 | 6 | 0.3 | 1026 | 100:138:36 | 2.5 | 35 | 0.54 | 0.92 |
| Comp. Ex. 11 | SiO$_2$ | 90 | 20 | 50 | 6 | 0.05 | 1060 | 100:200:11 | 2.7 | 28 | 0.12 | 0.51 |

As shown in Table 1, it was confirmed that barrier films (Examples 1-1 to 1-6) provided with, as a barrier layer, a silicon oxide film having an atomic ratio in a range of Si:O:C=100:160 to 190:30 to 50, a peak position of infrared-ray absorption due to Si—O—Si stretching vibration between 1030 to 1060 cm$^{-1}$, a film density in a range of 2.5 to 2.7 g/cm$^3$, and a distance between grains of 30 nm or shorter have the excellent barrier property (an oxygen transmission rate is 0.1 cc/m$^2$/day·atm or lower, and a water vapor transmission rate is 0.1 g/m$^2$/day or lower).

a winding up type hollow cathode type ion plating apparatus 101 equipped with a pressure gradient-type plasma gun shown in FIG. 11 so that a corona-untreated surface side of this substrate film was a surface on which a film is to be formed. This ion plating apparatus 101 is provided with a vacuum chamber 102, a supplying roll 103a for supplying a substrate film, a winding up roll 103b and a coating drum 104 for which are arranged in this vacuum chamber 102, a vacuum evacuating pump 105 connected to the vacuum chamber 102 via a valve, a diaphragm 109, a film making chamber 106 which is isolated from a vacuum chamber 102 with the diaphragm 109, a crucible 107 arranged at a lower part of this filmmaking chamber 106, an anode magnet 108, a pressure gradient-type plasma gun 110 arranged at a prescribed position (in the example shown in the FIG. 11, a right side wall of a film making chamber) of a filmmaking chamber 106, a convergent coil 111, a sheeted magnet 112, a valve 113 for adjusting an amount of an argon gas to be supplied to a pressure gradient-type plasma gun 110, a vacuum evacuating pump 114 connected to a film making chamber 106 via a valve, a valve 115 for adjusting an amount of a nitrogen gas to be supplied, and a valve 116 for adjusting an amount of an oxygen gas to be supplied.

Then, silicon oxide having a sintered density of 90%, as a film making material, was placed into a crucible 107. A distance (TS distance) between this film making material and a substrate film was set at 50 cm.

Then, as a gas to be added at film formation, an oxygen gas (manufactured by Taiyo Toyo Sanso Co., Ltd. (purity 99.9995% or higher)), a nitrogen gas (manufactured by Taiyo Toyo Sanso Co., Ltd. (purity 99.9999% or higher)), and an argon gas (manufactured by Taiyo Toyo Sanso Co., Ltd. (purity 99.9999% or higher)) were prepared.

Then, a pressure in chambers 102 and 106 was reduced to ultimate vacuum of $1.0 \times 10^{-3}$ Pa with vacuum evacuating pumps 105 and 114. Then, a nitrogen gas was introduced into a chamber 106 at flow rate of 10 sccm and an oxygen gas was introduced into a chamber 106 at a flow rate of 5 sccm, an internal pressure in a chamber was retained at 0.1 Pa by controlling an opening and closing degree of a valve between a vacuum evacuating pump and a chamber, a substrate film was run, an electric power of 9 kW for producing plasma was input into a pressure gradient-type plasma gun 110 into which an argon gas had been introduced at a flow rate of 20 sccm, vaporizing a film forming material by converging into a crucible 107 on an anode magnet 108 and irradiating, ionizing vapor molecules by high density plasma, to form a barrier layer comprising a silicon oxi-nitride film on a substrate film, to obtain a barrier film (Example 2-1). A running rate of a substrate film was set so that a film thickness of a formed silicon oxi-nitride film became 100 nm.

Components of the silicon oxi-nitride film formed in the above were measured under the following conditions, and results are shown in following Table 3.

Measurement of Components of Silicon Oxi-Nitride Film

Components were measured with ESCA (ESCA LAB 220i-XL manufactured by VG Scientific, England). As a X-ray source, a monochromic Al X-ray source having the Ag-3d-5/2 peak strength of 300 Kcps to 1 Mcps, and a slit having a diameter of about 1 mm were used. Measurement was performed in the state where a detector was set on a normal line of a sample surface to be measured, and adequate electrification correction was made. Analysis after measurement was performed by using software Eclipse version 2.1 attached to the above-mentioned ESCA apparatus and using peaks corresponding to the binding energies of Si: 2p, C:1s, O:1s, N:1s. Upon this, regarding each peak, Shirley's background removal was performed, and sensitivity coefficient correction was performed on each atom (based on C=1, Si=0.817, O=2.930, N=1.800) regarding each peak area, and an atomic ratio was obtained. Regarding the resulting atomic ratio, letting a number of Si atoms to be 100, numbers of O, N, and C atoms which are other components were calculated, and was used as a component ratio.

In addition, a maximum peak of infrared-ray absorption due to Si—O stretching vibration and Si—N stretching vibration, a film density and a distance between grains of a silicon oxi-nitride film formed as described above were measured under the following conditions, respectively, and the results are shown in following Table 3.

Measurement of Infrared Absorbing Spectrum

The infrared absorbing spectrum was measured as in example 1.

Measurement of Film Density

A film density was measured as in example 1 except a ratio of atoms (Si:N=3:4) of a thin film was input as a fitting initial value.

Measurement of Distance Between Grains

A distance between grains was measured as in example 1.

Then, according to the same manner as that of Example 2-1 except that a film forming material, or the film forming conditions (oxygen gas flow rate, nitrogen gas flow rate, TS distance, input electric power, and pressure inside the chamber) were set as shown in following Table 3 and Table 4, silicon oxi-nitride films were formed to manufacture barrier films (Examples 2-2 to 2-6, Comparative Examples 2-1 to 2-11). Regarding silicon oxi-nitride films of these barrier films, components, a maximum peak of infrared-ray absorption due to Si—O stretching vibration and Si—N stretching vibration, a film density and a distance between grains were measured as in Example 2-1, and the results are shown in following Table 3 and Table 4.

(Measurement of Barrier Property)

Regarding the thus manufactured barrier films (Examples 2-1 to 2-6, Comparative Examples 2-1 to 2-11), an oxygen transmission rate and a water vapor transmission rate were measured under the following conditions, and the results are shown in following Table 3 and Table 4.

Measurement of Oxygen Transmission Rate

An oxygen transmission rate was measured as in example 1.

Measurement of Water Vapor Transmission Rate

A water vapor transmission rate was measured as in example 1.

TABLE 3

| Barrier film | Film making material | | Film making conditions | | | | |
|---|---|---|---|---|---|---|---|
| | Material | Density (%) | Oxygen flow rate (sccm) | Nitrogen flow rate (sccm) | TS distance (cm) | Input elec. power (kW) | Pressure (Pa) |
| Ex. 1 | SiO | 90 | 5 | 10 | 50 | 6 | 0.1 |
| Ex. 2 | SiO | 90 | 5 | 20 | 50 | 6 | 0.1 |
| Ex. 3 | Si | 90 | 10 | 20 | 50 | 6 | 0.1 |
| Ex. 4 | SiO | 90 | 5 | 10 | 70 | 6 | 0.1 |
| Ex. 5 | Si | 90 | 10 | 5 | 50 | 6 | 0.1 |
| Ex. 6 | SiO | 90 | 5 | 20 | 50 | 9 | 0.1 |

TABLE 3-continued

| | Silicon oxi-nitride film | | | | Barrier property | |
|---|---|---|---|---|---|---|
| Barrier film | Si—O/Si—N peak position (cm$^{-1}$) | Atomic ratio Si:O:N:C | Film density (g/cm$^3$) | Distance between grains (nm) | Oxygen transmission rate (cc/m$^2$/day·atm) | Water vapor transmission rate (g/m$^2$/day) |
| Ex. 1 | 941 | 100:108:60:32 | 2.8 | 23 | 0.03 | 0.06 |
| Ex. 2 | 917 | 100:94:68:35 | 2.9 | 25 | 0.05 | 0.01 |
| Ex. 3 | 932 | 100:85:65:35 | 3.0 | 25 | 0.03 | 0.02 |
| Ex. 4 | 1000 | 100:103:47:32 | 2.7 | 29 | 0.08 | 0.09 |
| Ex. 5 | 985 | 100:110:40:32 | 2.7 | 28 | 0.03 | 0.07 |
| Ex. 6 | 938 | 100:98:70:50 | 3.0 | 28 | 0.07 | 0.05 |

TABLE 4

| | Film making material | Film making material | | | | |
|---|---|---|---|---|---|---|
| Barrier film | Material | Density (%) | Oxygen flow rate (sccm) | Nitrogen flow rate (sccm) | TS distance (cm) | Input power (kW) | Pressure (Pa) |
| Comp. Ex. 1 | SiO | 90 | 5 | 5 | 50 | 6 | 0.1 |
| Comp. Ex. 2 | SiO | 90 | 0 | 20 | 50 | 6 | 0.1 |
| Comp. Ex. 3 | SiO | 90 | 5 | 10 | 50 | 6 | 0.25 |
| Comp. Ex. 4 | SiO | 90 | 5 | 10 | 35 | 6 | 0.1 |
| Comp. Ex. 5 | SiO | 90 | 5 | 10 | 50 | 9 | 0.1 |
| Comp. Ex. 6 | SiO | 70 | 5 | 10 | 50 | 6 | 0.1 |
| Comp. Ex. 7 | Si | 90 | 1 | 20 | 50 | 6 | 0.1 |
| Comp. Ex. 8 | Si | 90 | 10 | 10 | 50 | 6 | 0.1 |
| Comp. Ex. 9 | Si | 70 | 10 | 20 | 50 | 6 | 0.1 |
| Comp. Ex. 10 | SiO | 90 | 10 | 5 | 50 | 6 | 0.1 |
| Comp. Ex. 11 | Si | 90 | 1 | 30 | 50 | 6 | 0.1 |

| | Silicon oxi-nitride film | | | | Barrier property | |
|---|---|---|---|---|---|---|
| Barrier film | Si—O/Si—N peak position (cm$^{-1}$) | Atomic ratio Si:O:N:C | Film density (g/cm$^3$) | Distance between grains (nm) | Oxygen transmission rate (cc/m$^2$/day·atm) | Water vapor transmission rate (g/m$^2$/day) |
| Comp. Ex. 1 | 980 | 100:95:30:25 | 2.8 | 28 | 0.45 | 0.72 |
| Comp. Ex. 2 | 928 | 100:81:53:41 | 2.9 | 37 | 0.63 | 0.20 |
| Comp. Ex. 3 | 1008 | 100:65:52:33 | 2.6 | 43 | 1.27 | 1.55 |
| Comp. Ex. 4 | 933 | 100:91:68:52 | 2.9 | 42 | 0.84 | 0.93 |
| Comp. Ex. 5 | 938 | 100:110:67:55 | 3.1 | 27 | 0.89 | 0.28 |
| Comp. Ex. 6 | 945 | 100:88:57:34 | 2.6 | 29 | 0.14 | 0.15 |
| Comp. Ex. 7 | 893 | 100:77:45:33 | 2.8 | 35 | 0.92 | 0.31 |
| Comp. Ex. 8 | 928 | 100:93:58:31 | 2.9 | 32 | 0.18 | 0.25 |
| Comp. Ex. 9 | 945 | 100:65:45:34 | 2.6 | 28 | 0.46 | 0.31 |
| Comp. Ex. 10 | 992 | 100:120:35:48 | 2.6 | 34 | 0.25 | 0.47 |
| Comp. Ex. 11 | 932 | 100:81:85:43 | 2.8 | 32 | 1.03 | 0.62 |

As shown in Table 3, it was confirmed that barrier films (Examples 2-1 to 2-6) provided with, as a barrier layer, a silicon oxi-nitride film having an atomic ratio in a range of Si:O:N:C=100:80 to 110:40 to 70:30 to 50, a maximum peak of infrared-ray absorption due to Si—O stretching vibration and Si—N stretching vibration in a range of 900 to 1000 cm$^{-1}$, a film density in a range of 2.7 to 3.0 g/cm$^3$, and a distance between grains of 30 nm or shorter have the excellent barrier property (an oxygen transmission rate is 0.1 cc/m$^2$/day·atm or lower, and a water vapor transmission rate is 0.1 g/m$^2$/day or lower).

To the contrary, as shown in Table 4, none of barrier films (Comparative Examples 2-1 to 2-11) provided with, as a barrier layer, a silicon oxi-nitride film having at least one of, an atomic ratio, a maximum peak of infrared-ray absorption due to Si—O stretching vibration and Si—N stretching vibration, a film density and a distance between grains which are outside of the above-mentioned ranges had the excellent barrier property (an oxygen transmission rate is 0.1 cc/m$^2$/day·atm or smaller, a water vapor transmission rate is 0.1 g/m$^2$/day or smaller).

I claim:

1. A method for manufacturing a barrier film, comprising forming, as a barrier layer, a silicon oxide film having an atomic ratio in a range of Si:O:C=100:(170 to 190):(40 to 50), a peak position of infrared-ray absorption due to Si—O—Si stretching vibration between 1030 to 1060 cm$^{-1}$, a film density in a range of 2.5 to 2.7 g/cm$^3$ and a distance between grains of 30 nm or shorter, on a substrate film which is composed of carbonaceous resin, using either of silicon having a sintered density of 80% or higher or SiO$_x$ ('x' is 1 to 2) having a sintered density of 80% or higher as a film forming material, in the presence of an oxygen gas by an ion plating method, wherein carbon generated by etching the substrate film composed of the carbonaceous resin is absorbed in the silicon oxide film when forming the silicon oxide film on the substrate film composed of the carbonaceous resin by the ion plating method, the distance between grains is a distance between grains formed by growing each growing nucleus when forming the silicon oxide film, and wherein the barrier layer on the substrate film is the barrier film, which has an oxygen transmission rate of which is 0.05 cc/m$^2$/day•atm or less, and a water vapor transmission rate of which is 0.07 g/m$^2$/day or less, is manufactured.

2. The method for manufacturing a barrier film according to claim 1, wherein the ion plating method is a hollow cathode type ion plating method.

3. A method for manufacturing a barrier film comprising the steps of:

providing a carbonaceous resin layer on a substrate film in advance; and forming, as a barrier layer, a silicon oxide film having an atomic ratio in a range of Si:O:C=100:(170 to 190):(40 to 50), a peak position of infrared-ray absorption due to Si—O—Si stretching vibration between 1030 to 1060 cm$^{-1}$, a film density in a range of 2.5 to 2.7 g/cm$^3$ and a distance between grains of 30 nm or shorter, on the carbonaceous resin layer, using either of silicon having a sintered density of 80% or higher or SiO$_x$ ('x' is 1 to 2) having a sintered density of 80% or higher as a film forming material, in the presence of an oxygen gas by an ion plating method, wherein carbon generated by etching the carbonaceous resin layer is absorbed in the silicon oxide film when forming the silicon oxide film on the carbonaceous resin layer by the ion plating method, the distance between grains is a distance between grains formed by growing each growing nucleus when forming the silicon oxide film, and wherein the barrier layer on the carbonaceous resin layer on the substrate film is the barrier film, which has an oxygen transmission rate of which is 0.05 cc/m$^2$/day•atm or less, and a water vapor transmission rate of which is 0.07 g/m$^2$/day or less.

4. The method for manufacturing a barrier film according to claim 3, wherein the ion plating method is a hollow cathode type ion plating method.

* * * * *